United States Patent [19]

Yamagishi et al.

[11] Patent Number: 4,802,177
[45] Date of Patent: Jan. 31, 1989

[54] SEMICONDUCTOR LASER MOUNT

[75] Inventors: Kenichi Yamagishi; Kazuo Horikawa; Hiromi Ishikawa, all of Kaisei, Japan

[73] Assignee: Fuji Photo Film Co., Ltd., Japan

[21] Appl. No.: 840,738

[22] Filed: Mar. 18, 1986

[30] Foreign Application Priority Data

Mar. 20, 1985 [JP] Japan .................................. 60-56938

[51] Int. Cl.$^4$ .......................... H01S 3/04; B31B 1/60; H01L 39/02
[52] U.S. Cl. ......................................... 372/36; 357/80; 357/81; 414/904; 174/16.3; 156/60
[58] Field of Search ...................... 372/36; 357/80, 81; 414/904; 174/16 HS, 52; 165/80.2, 80.5, 104.33; 361/380, 381; 350/357; 156/556, 547, 64, 48, 60, 268, 274.8, 298, 608

[56] References Cited

U.S. PATENT DOCUMENTS 4,567,505  1/1986  Pease et al. .......................... 357/81

Primary Examiner—William L. Sikes
Assistant Examiner—Georgia Y. Epps
Attorney, Agent, or Firm—Gerald J. Ferguson, Jr.

[57] ABSTRACT

A semiconductor laser is mounted on a support by way of a semiconductor laser mount. The semiconductor laser mount is provided, in the surface to be mated with the support, with an adhesive retaining groove which substantially surrounds the mounting position of the semiconductor laser. The adhesive retaining groove is communicated with an inlet and an outlet each of which opens in a surface of the mount other than the mating surface. When bonding the semiconductor laser mount to the support, the laser mount is first located in a predetermined position relative to the support, and then adhesive is charged into the adhesive retaining groove through the inlet. The mount is secured to the support by the adhesive charged into the groove.

8 Claims, 2 Drawing Sheets

SEMICONDUCTOR LASER MOUNT

BACKGROUND OF THE INVENTION

1. Field of the Invention

This invention relates to a semiconductor laser mount for mounting a semiconductor laser on a support.

2. Description of the Prior Art

There have been used various light beam scanning systems in which a light beam is deflected by a light deflector to scan a recording medium to record thereon various information or to read information recorded thereon. In such light beam scanning systems, there has been used a semiconductor laser as the means for generating the light beam. The semiconductor laser is advantageous over other light sources such as a gas laser in that it is small in size and inexpensive, and has low power consumption. Further, in the case of the semiconductor laser, the light beam can be directly modulated by changing the driving current. On the other hand, the semiconductor can continuously output 20 to 30 mw at most and accordingly, it has been difficult to use the semiconductor laser in light beam scanning systems in which a high energy light beam is required. Accordingly, there has been generally obtained a scanning light beam having a high energy by synthesizing laser beams emitted by a plurality of semiconductor lasers into a single laser beam.

However, in order to effectively synthesize a plurality of laser beams emitted by a plurality of semiconductor lasers into a single laser beam having a high energy, each of the semiconductor lasers must be precisely held in a predetermined position so that the laser beam emitted thereby precisely travels along a predetermined path. Generally, each semiconductor laser is fixed to a support such as a heat sink by way of a semiconductor laser mount. Conventionally, the semiconductor laser mount is fixed to the support by adhesive applied to the mating surfaces of the mount and the support substantially over the entire area thereof. However, the adhesive is apt to shrink in volume and the semiconductor mount to be displaced from the predetermined position due to the shrinkage of the adhesive. Further, when unevenness in the thickness of the adhesive layer exists due to unevenness in the coating thickness or shrinkage of the adhesive, the semiconductor mount is liable to be inclined, thereby inclining the optical axis of the laser beam emitted by the semiconductor laser mounted by the mount.

SUMMARY OF THE INVENTION

In view of the foregoing observations and description, the primary object of the present invention is to provide a semiconductor laser mount which can be bonded to a support in a predetermined position with accuracy without being affected by shrinkage of the adhesive or unevenness in coating thickness.

The semiconductor laser mount in accordance with the present invention is provided, in the mating surface to be mated with the support, with an adhesive retaining groove which substantially surrounds the mounting position of the semiconductor laser. The adhesive retaining groove is communicated with an inlet and an outlet each of which opens in a surface of the mount other than the mating surface.

When bonding the semiconductor laser mount of the present invention to the support, the laser mount is first located in a predetermined position relative to the support, and then adhesive is charged into the adhesive retaining groove through the inlet. The mount is secured to the support by the adhesive charged into the groove. Therefore, there cannot arise a problem that the adhesive on the mating surface is uneven in thickness. Further, since the adhesive is accommodated in the groove, shrinkage in volume of the adhesive cannot affect the position of the mount.

DESCRIPTION OF THE PREFERRED EMBODIMENTS

Figure 1:
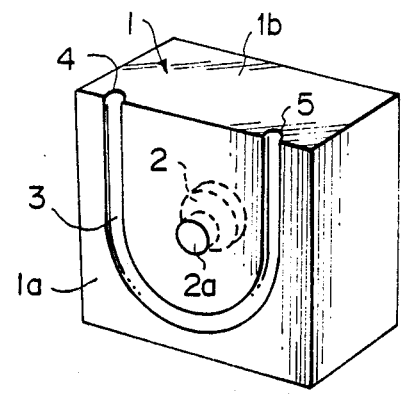
FIG. 1 is a perspective view of a semiconductor laser mount in accordance with an embodiment of the present invention.

In FIG. 1, a semiconductor laser 2 is secured to the middle portion of a mount 1 in accordance with an embodiment of the present invention which is a rectangular block in shape in this particular embodiment. The emanating end portion 2a of the laser 2 projects from one end face or a mating face 1a of the mount 1. That is, the mount 1 is fixed to a support 6 (FIG. 2) with the end face 1a mated with the support 6 as will be described later. A U-shaped adhesive retaining groove 3 is formed in the mating face 1a to surround the emanating end portion 2a of the semiconductor laser 2. Both ends of the adhesive retaining groove 3 open in the upper face 1b of the mount 1 to respectively form an inlet 4 and an outlet 5.

When mounting the semiconductor laser 2 on the support 6 (which may be a heat sink, for example), the mount 1 is located in a predetermined position relative to the support 6 with the mating face 1a pressed against the mating face 6a of the support 6. Then, adhesive is charged into the adhesive retaining groove 3 from the inlet 4 to fill the groove 3 while discharging air therein through the outlet 5. Charging of the adhesive is continued until the adhesive reaches the outlet 5. By the adhesive thus charged into the groove 3, the mount 1 is bonded to the support 6. By bonding the mount 1 to the support 6 in this manner, the mount 1 can be bonded to the support 6 without removal from the predetermined position during the bonding operation, and by the adhesive accommodated in the groove 3. Accordingly, the mount 1 cannot be displaced from the predetermined position due to unevenness in coating thickness of the adhesive or shrinkage of the same.

Figure 2:
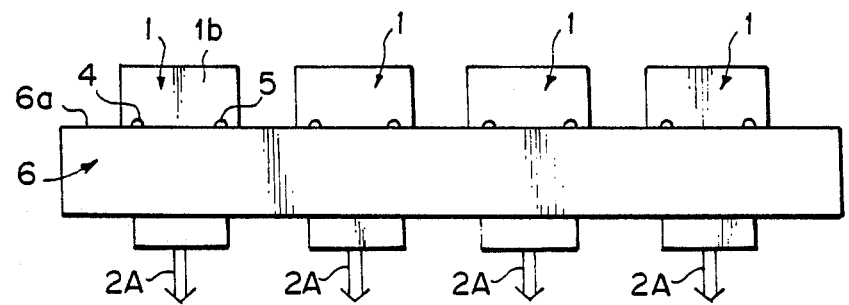
FIG. 2 is a plan view showing a plurality of laser mounts of the embodiment bonded to a support.

FIG. 2 shows an example of a system for synthesizing laser beams emitted by a plurality of semiconductor lasers 2. By mounting each of the lasers 2 by way of the mount 1 of this embodiment, each laser 2 can be precisely held in a predetermined position so that the laser beam 2A emitted thereby (and generally collimated by a collimator lens (not shown) provided in the support 6) travels precisely along a desired optical path, whereby the laser beams 2A can be effectively synthesized.

FIGS. 3 to 6 are views illustrating semiconductor mounts in accordance with other embodiments of the present invention.

Figure 3:
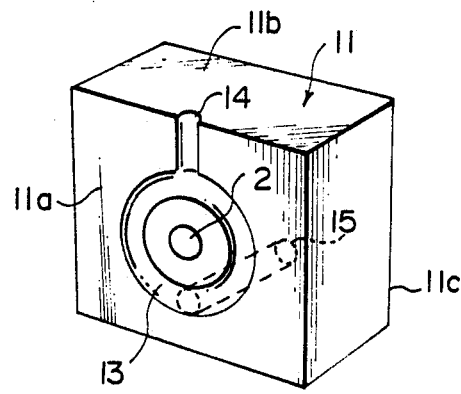
FIGS. 3 to 6 are views respectively showing other embodiments of the present invention.

The mount 11 shown in FIG. 3 is provided with an annular adhesive retaining groove 13 on the mating face 11a. The uppermost portion of the groove 13 is communicated with an inlet 14 opening in the upper face 11b of the mount 11, and the lowermost portion of the groove 13 is communicated with an outlet 15 opening in the rear face 11c of the mount 11 by way of a bore. The annular adhesive retaining groove 13 surrounds the laser 2.

Figure 4:
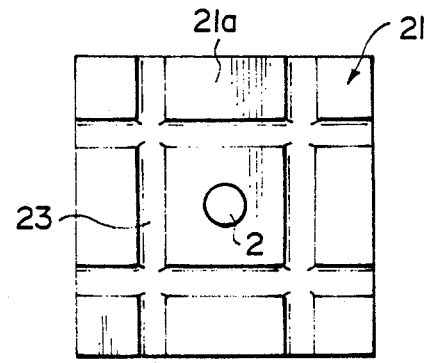

In the mount 21 shown in FIG. 4, the adhesive retaining groove 23 formed in the mating face 21a comprises a pair of horizontal grooves and a pair of vertical grooves crossing with each other. Each of the horizontal grooves open at both ends in the opposed side faces of the mount 21, and each of the vertical grooves open at both ends in the upper and lower faces. The laser 2 is disposed in the portion surrounded by the four grooves. In this case, one or more of the open ends of the grooves may be used as the inlet or the outlet, and the inlet or the outlet may be changed according to the position of the mount 21 in which the mount 21 is bonded to the support 6.

Figure 5:
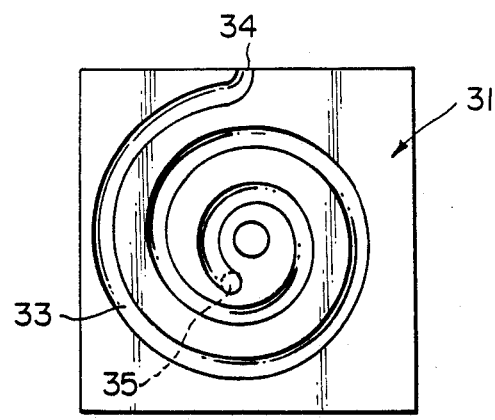

In the mount 31 shown in FIG. 5, the adhesive retaining groove 33 is in the form of a spiral groove the outer end of which opens in the upper face to form the inlet 34, and the inner end of which is communicated with the outlet 35 formed in the rear face by way of a bore.

Figure 6:
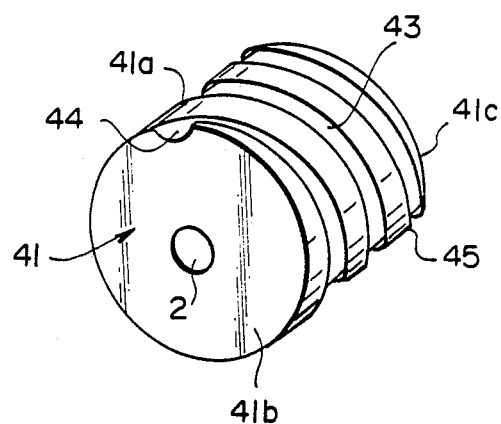

Though in the embodiments shown in FIGS. 1 to 5, the mating surface of the mount is one the end faces, the mount 41 shown in FIG. 6 is cylindrical in shape and its circumferential surface forms the mating face. That is, a spiral adhesive retaining groove 43 is formed in the circumferential surface 41a of the cylindrical mount 41. One end of the spiral groove 43 opens in the front end face 41b to form the inlet 44 and the other end of the spiral groove 43 opens in the rear end face 41c of the same to form the outlet 45.

We claim:

1. A semiconductor laser mount to which a semiconductor laser is mounted, said laser mount being bonded to a support to mount the semiconductor laser with respect to the support, said laser mount being characterized by having an adhesive retaining groove provided in a mating face thereof which is to be mated with the support, the adhesive retaining groove extending to substantially surround the semiconductor laser in the mating face such that the adhesive is present only in said groove so that the laser mount and the support are bonded to one another only by the adhesive in the groove, and said adhesive retaining groove opening at at least one of the faces other than the mating face at at least two portions of said at least one of said other faces so that the adhesive may be injected into said groove at one of said portions and air may be ejected at the other of said portions when the adhesive is injected into the groove.

2. A semiconductor laser mount as defined in claim 1 which is rectangular block in shape and in which said mating face is one of the opposed end faces.

3. A semiconductor laser mount as defined in claim 2 in which said adhesive retaining groove is a U-shaped groove opposite ends of which open in the upper face of the rectangular block.

4. A semiconductor laser mount as defined in claim 2 in which said adhesive retaining groove is an annular groove the uppermost portion of which is communicated with an opening formed in the upper face of the mount and the lower most portion of which is communicated with an opening formed in the other end face by way of a bore.

5. A semiconductor laser mount as defined in claim in which said adhesive retaining groove comprises a pair of horizontal grooves and a pair of vertical grooves, each of the grooves opening in the corresponding side faces at both ends.

6. A semiconductor laser mount as defined in claim 2 in which said adhesive retaining groove is a spiral groove the outer end of which is communicated with an opening formed in the upper face of the mount and the inner end of which is communicated with an opening formed in the other end face by way of a bore.

7. A semiconductor laser mount as defined in claim 1 which is cylindrical in shape and in which said mating face is the circumferential surface thereof.

8. A semiconductor laser mount as defined in claim 7 in which said adhesive retaining groove is a spiral groove formed in the circumferential surface of the mount.

* * * * *